United States Patent
Chen

(10) Patent No.: US 7,964,106 B2
(45) Date of Patent: Jun. 21, 2011

(54) METHOD FOR FABRICATING A PACKAGING SUBSTRATE

(75) Inventor: Chang-Fu Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 629 days.

(21) Appl. No.: 12/129,689

(22) Filed: May 30, 2008

(65) Prior Publication Data

US 2009/0294401 A1 Dec. 3, 2009

(51) Int. Cl.
*H01B 13/00* (2006.01)
*H01L 21/00* (2006.01)

(52) U.S. Cl. .......... 216/13; 216/41; 216/95; 216/96; 438/106; 438/108; 29/846; 29/854

(58) Field of Classification Search .......... 216/13, 216/41, 95, 96; 438/106, 108; 29/846, 854
See application file for complete search history.

(56) References Cited

U.S. PATENT DOCUMENTS

| 5,778,529 A | * | 7/1998 | Beilin et al. ............ 29/852 |
| 2005/0186705 A1 | * | 8/2005 | Jackson et al. ............ 438/106 |
| 2008/0122079 A1 | * | 5/2008 | Chen et al. ............ 257/737 |

FOREIGN PATENT DOCUMENTS

| TW | I252721 | 4/2006 |
| TW | I258828 | 7/2006 |

* cited by examiner

*Primary Examiner* — Shamim Ahmed
(74) *Attorney, Agent, or Firm* — Winston Hsu; Scott Margo

(57) ABSTRACT

A method of fabricating a packaging substrate is disclosed. A cladding sheet comprised of a first metal foil, a second metal foil and an etch stop layer interposed between the first and second metal foils is provided. The first metal foil is then patterned into a first circuit trace. An insulating layer is laminated onto the first circuit trace. Thereafter, the second metal foil is patterned into a plurality of bump pads. The etch stop layer that is not covered by the bump pads is stripped off. A solder mask is applied to fill the spacing between the bump pads. A top surface of each of the bump pads is etched to form a bonding aperture in a self-aligned fashion.

17 Claims, 5 Drawing Sheets

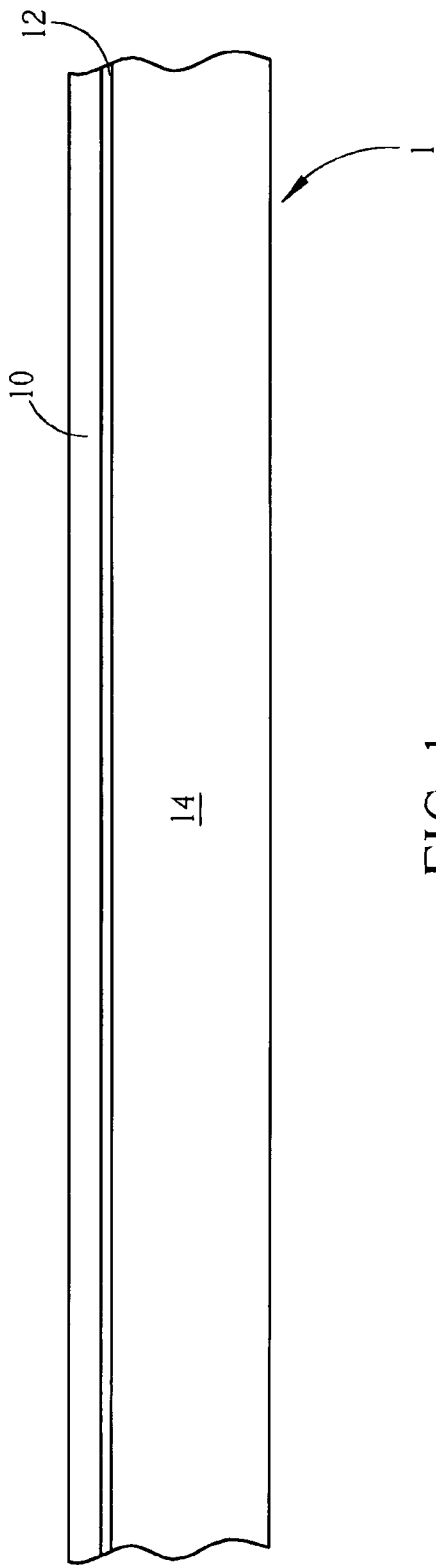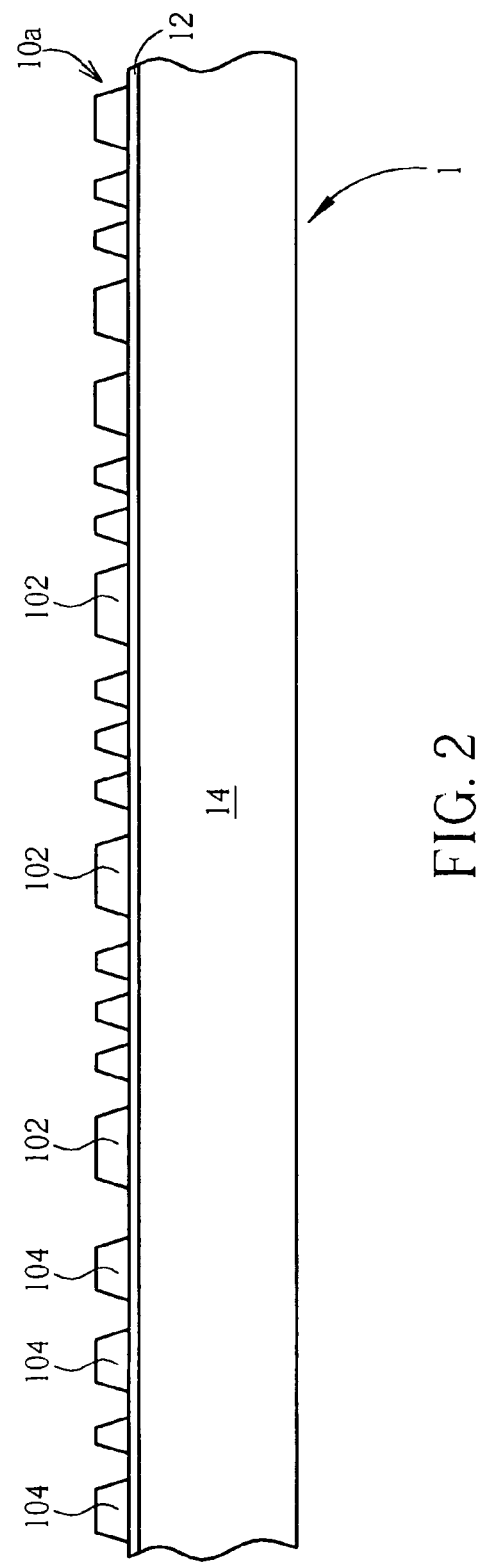
FIG. 1
FIG. 2

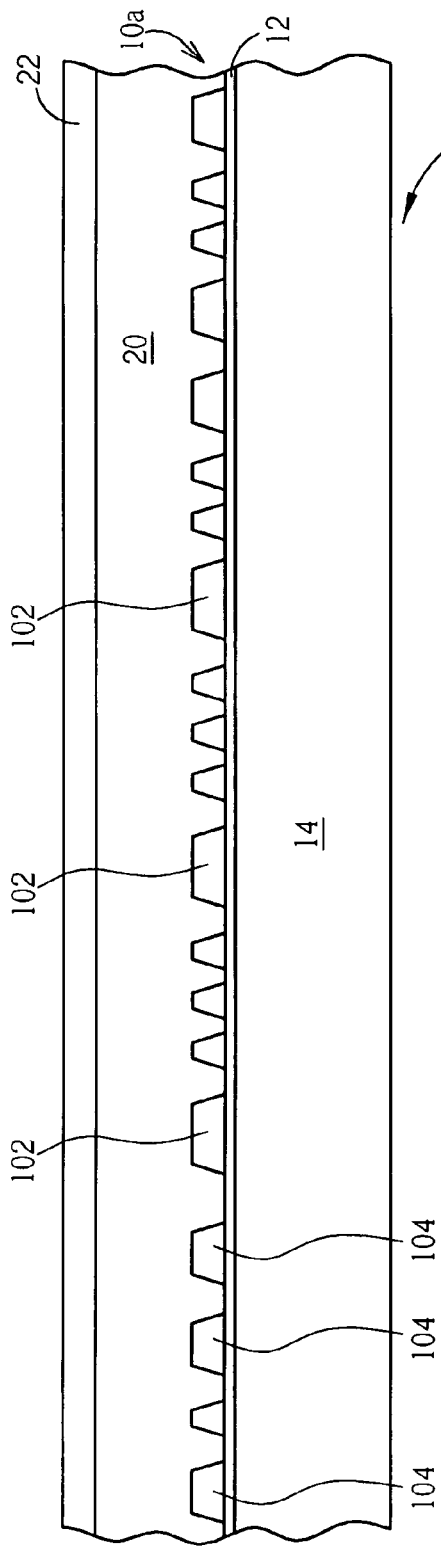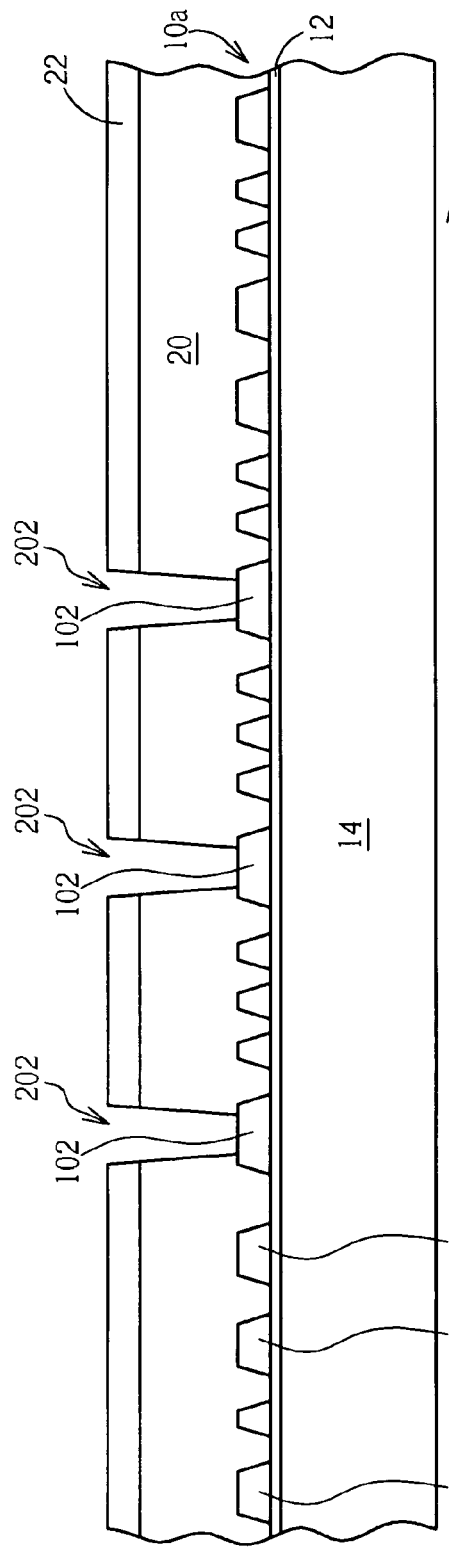

METHOD FOR FABRICATING A PACKAGING SUBSTRATE

BACKGROUND OF THE INVENTION

1. Field of the Invention

The present invention relates generally to a method for fabricating a packaging substrate or carrier. More particularly, the present invention relates to a method for fabricating a flip-chip substrate. According to this invention, bonding apertures are formed on a chip side of the substrate in a self-aligned fashion, thereby improving the solder mask registration accuracy.

2. Description of the Prior Art

As known in the art, a packaging substrate or carrier is widely used in the semiconductor packaging to electrically connect a chip or die and a motherboard, and to dissipate the heat originated from the chip as well. The chip in the package is typically encapsulated and protected by molding compounds. Conventionally, a prior art packaging substrate is a laminate structure composed of patterned metal layers and insulating layers. The patterned metal layers are electrically interconnected together by means of plated through holes.

In "standard" packaging, the interconnection between the die and the carrier is made using wire. The die is attached to the carrier face up. A wire is then bonded first to the die, then looped and bonded to the carrier. In contrast, the interconnection between the die and carrier in flip-chip packaging is made through a conductive bump that is placed directly on the die surface. The bumped die is then flipped over and placed face down, with the bumps connecting to the carrier directly.

Demands have been recently increasing for very high-density packaging substrate for high-pin-count area array flip-chip interconnections. The term "flip-chip" refers to an electronic component or semiconductor device that can be mounted directly onto a substrate or carrier in a "face-down" manner. Because flip-chip packages do not require wirebonds, their size is much smaller than their conventional counterparts. The inductance of the signal path is greatly reduced because the flip-chip interconnection is much shorter in length. Besides, since flip chip can connect over the surface of the die, it can support vastly larger numbers of interconnects on the same die size.

However, the manufacture of the flip-chip substrate still has some bottleneck obstacles that need to be overcome. For example, in the prior art processes of making a flip-chip substrate, an additional exposure step and a development step are required to form solder mask openings in a solder mask layer in order to expose the underlying metal pads. This prior art approach suffers from misalignment problems.

SUMMARY OF THE INVENTION

It is one objective of the invention to provide a novel method for fabricating a flip-chip substrate in order to solve the above-mentioned prior art problems and shortcomings.

To these ends, according to one aspect of the present invention, there is provided a method for fabricating a packaging substrate. A cladding sheet comprising a first metal foil, a second metal foil and an etch stop layer interposed between the first and second metal foils is provided. The first metal foil is patterned into a first circuit trace including a plurality of metal contact pads. An insulating layer is laminated onto the first circuit trace. The second metal foil is then patterned into a plurality of bump pads. The etch stop layer that is not covered by the bump pads is removed, thereby exposing a portion of the insulating layer and the first circuit trace. A solder mask is then applied onto the exposed insulating layer and the first circuit trace to fill spacing between the bump pads, wherein a top surface of each of the bump pads is not covered by the solder mask. A predetermined thickness of the top surface of each of the bump pads is etched away to form a bonding aperture in a self-aligned fashion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic, cross-sectional diagrams showing a method for fabricating a flip-chip substrate in accordance with one preferred embodiment of this invention.

DETAILED DESCRIPTION

Figure 5:
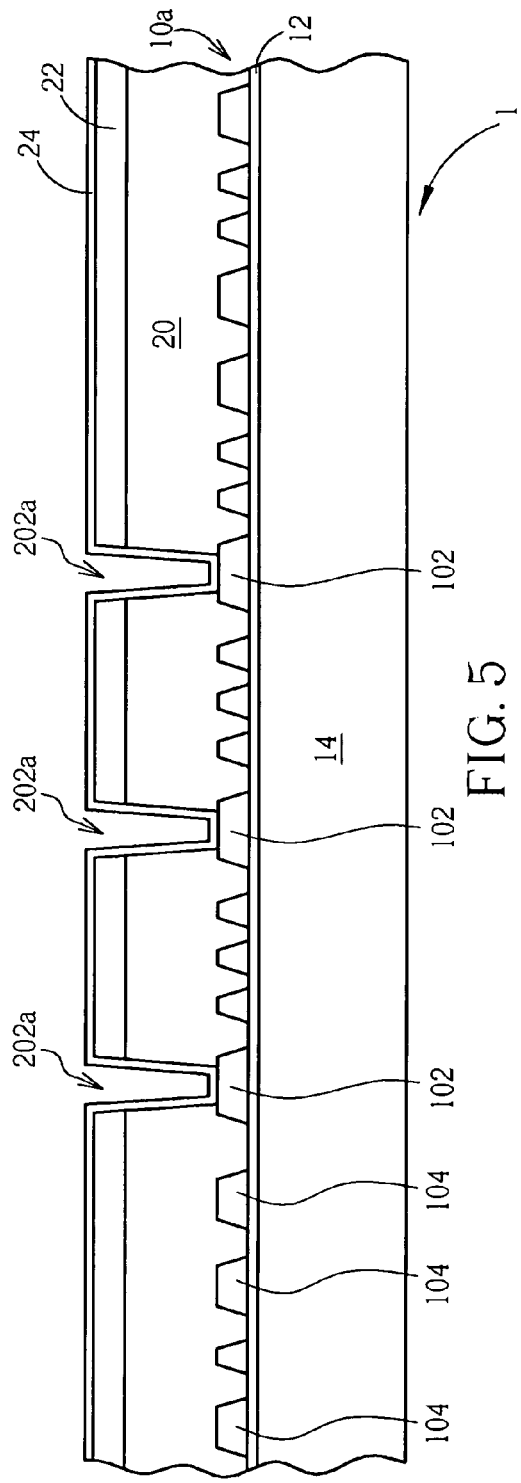

Without the intention of a limitation, the invention will now be described and illustrated with the reference to the preferred embodiments. Please refer to FIG. 1 to FIG. 10. FIGS. 1-10 are schematic, cross-sectional diagrams showing a method for fabricating a flip-chip substrate in accordance with one preferred embodiment of this invention. As shown in FIG. 1, a cladding sheet 1 that is composed of a first metal layer 10, an etching stop layer 12 and a second metal layer 14 is provided. The etching stop layer 12 is interposed between the first metal layer 10 and the second metal layer 14. Preferably, the first metal layer 10 and the second metal layer 14 are both copper foils, and the etching stop layer 12 may be a nickel foil or a silver foil, which, however, should not be seen as to limit the scope of the present invention. It is understood that the first, second metal layers 10 and 14 and the etching stop layer 12 may comprise any other suitable materials. According to the preferred embodiment of this invention, the cladding sheet 1 may be a Cu/Ni/Cu cladding sheet or a Cu/Ag/Cu cladding sheet.

According to the preferred embodiment of this invention, the first metal layer 10 has a thickness ranging between 10 micrometers and 30 micrometers, for example, 18 micrometers. The etching stop layer 12 has a thickness ranging between 1 micrometer and 2 micrometers. The second metal layer 14 has a thickness ranging between 40 micrometers and 120 micrometers, for example, 60 micrometers or 80 micrometers. Preferably, the thickness of the second metal layer 14 is greater than that of the first metal layer 10.

As shown in FIG. 2, a conventional lithographic process and an etching process are carried out to pattern the first metal layer 10, thereby forming a first circuit trace 10a that includes via landing pads 102 and metal contact pads 104. The aforesaid lithographic process and etching process generally comprise the steps of forming a first dry-film photoresist layer (not shown) on the first metal layer 10, forming a second dry-film photoresist layer (not shown) on the second metal layer 14, then subjecting the first dry-film photoresist layer to exposure and development processes thereby forming an etch mask pattern, thereafter selectively etching away the first metal layer 10 that is not covered by the etch mask pattern to expose a portion of the etching stop layer 12, and then stripping the etch mask pattern and the second dry-film photoresist layer.

As shown in FIG. 3, subsequently, an insulating layer 20 is formed on the cladding sheet 1 to cover the first circuit trace 10a and the exposed portion of the etching stop layer 12. For example, the insulating layer 20 may comprise prepreg, Ajinomoto Build-up Film (ABF), epoxy resins or polyimide. A third metal layer 22 is provided on the insulating layer 20. The third metal layer 22 may be, for example, a copper foil. Alternatively, a resin-coated copper (RCC) may be laminated and pressed on the cladding sheet 1 to cover the first circuit trace 10a and the exposed portion of the etching stop layer 12.

As shown in FIG. 4, the third metal layer 22 and the insulating layer 20 are subjected to a drilling process such as a laser drilling process or a mechanical drilling process to form a plurality of blind via holes 202 in the third metal layer 22 and the insulating layer 20. The blind via holes 202 are aligned with the via landing pads 102, respectively, and expose portions of the corresponding via landing pads 102.

As shown in FIG. 5, an electroplating process such as an electroless plating process is then carried out to form an electrolessly plated copper layer 24 on the interior surface of the blind via holes 202 and on the surface of the third metal layer 22, thereby forming plated via holes 202a in the insulating layer 20.

Figure 6:
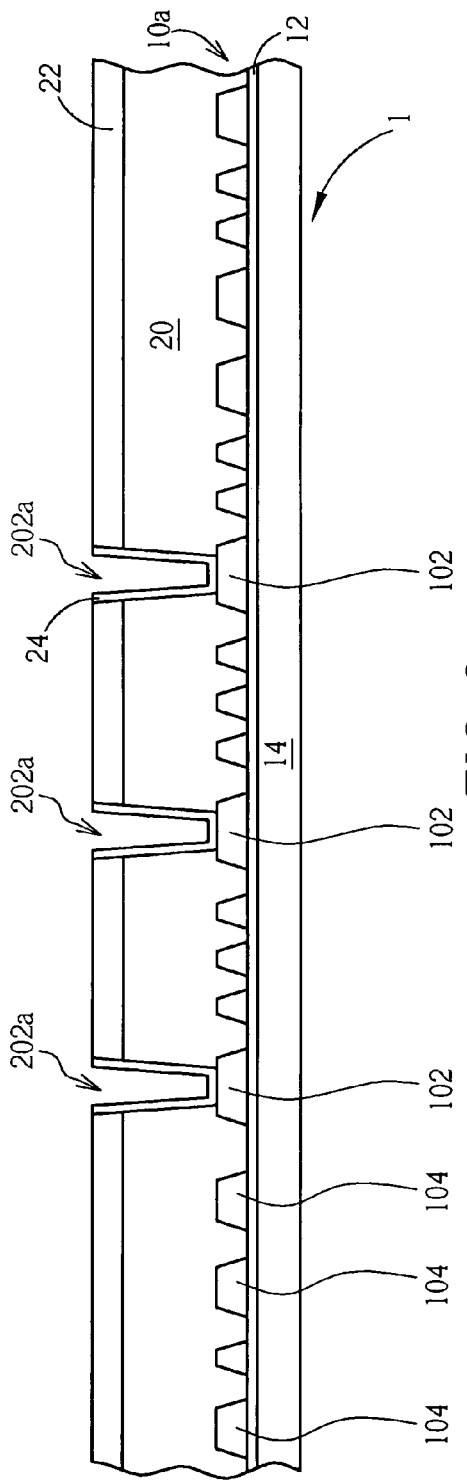

As shown in FIG. 6, a conventional copper thickness reduction process such as polishing or grinding is carried out to reduce the thickness of the second metal layer 14 and the thickness of the third metal layer 22 to a desired thickness range respectively. For example, after the copper thickness reduction process, the thickness of the second metal layer 14 preferably ranges between 15 micrometers and 25 micrometers, and the thickness of the third metal layer 22 preferably ranges between 15 micrometers and 25 micrometers.

Figure 7:
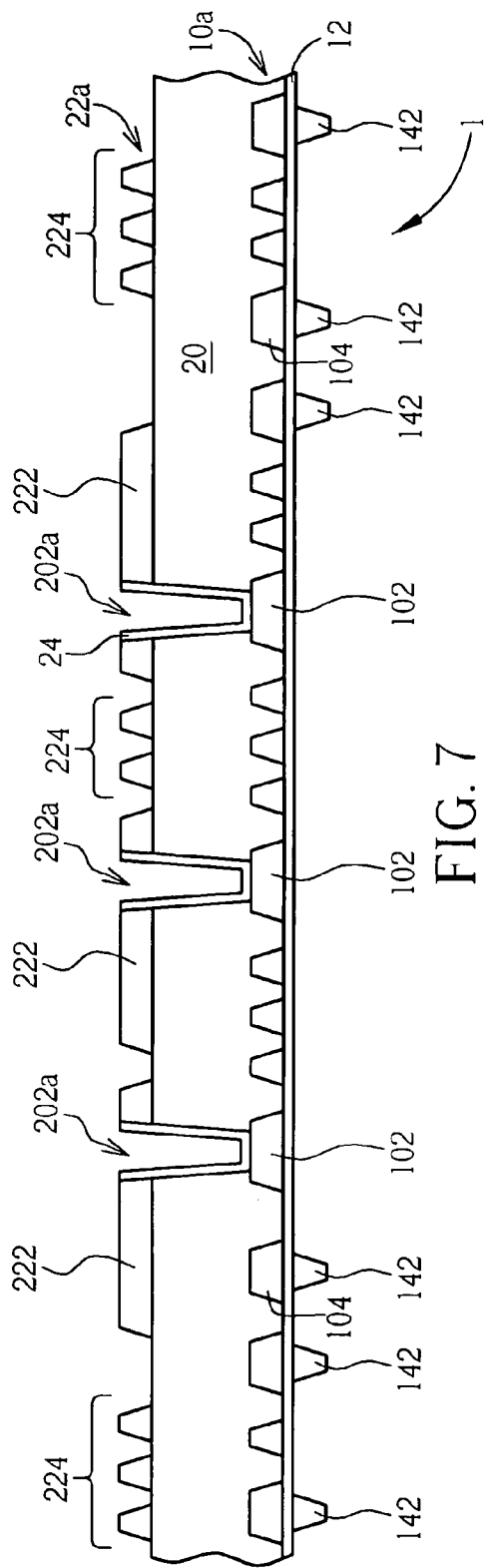

As shown in FIG. 7, after the formation of the plated via holes 202a, a conventional lithographic process and an etching process are performed to pattern the third metal layer 22 into a second circuit trace 22a including solder ball bond pads 222 and fine-pitch circuit traces 224, and pattern the second metal layer 14 into bump pads 142, thereby exposing a portion of the surface of the etching stop layer 12 on the side opposite to the second circuit trace 22a. The bump pads 142 are aligned with the corresponding metal contact pads 104. Likewise, the aforesaid lithographic process and etching process comprise the steps of forming a dry-film photoresist layer (not shown), then subjecting the dry-film photoresist layer to exposure and development processes thereby forming an etch mask pattern, thereafter selectively etching away the underlying metal layer that is not covered by the etch mask pattern, and then stripping the etch mask pattern. It is noteworthy that at this point the second circuit trace 22a is embossed on the insulating layer 20, while the first circuit trace 10a is inlaid into the insulating layer 20.

Figure 8:
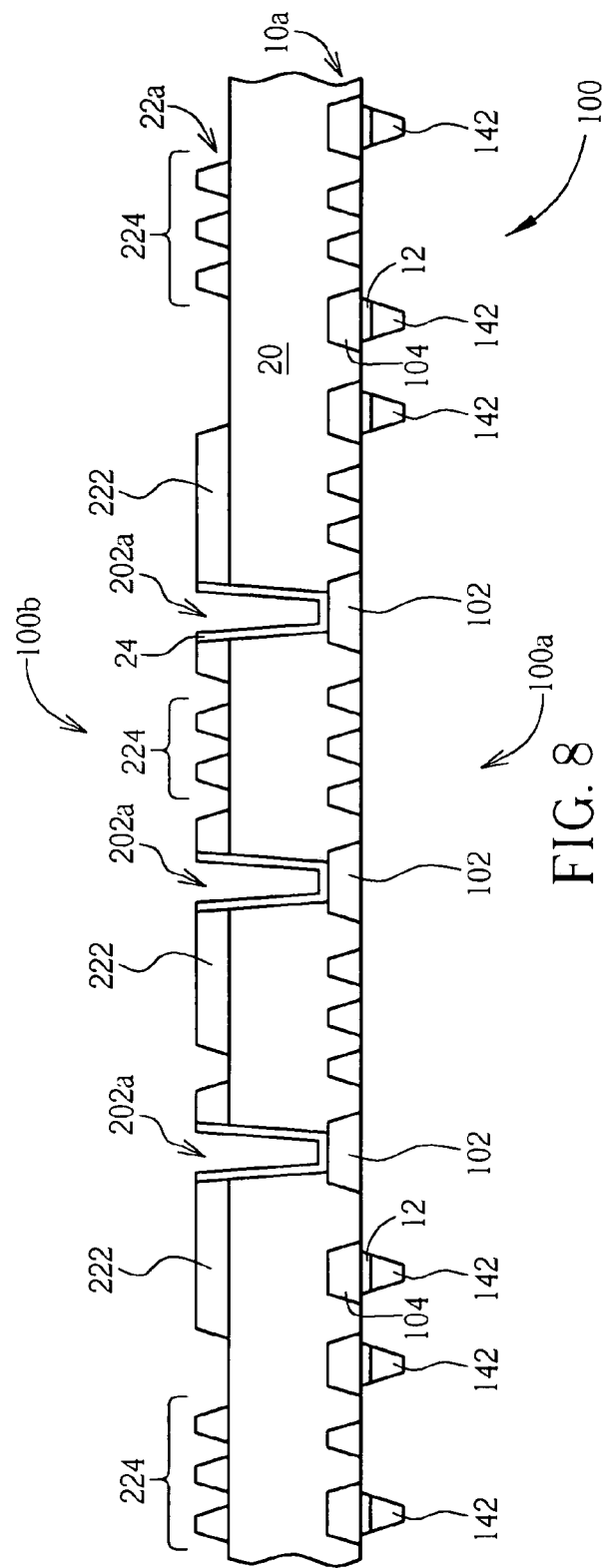

As shown in FIG. 8, subsequently, the exposed etching stop layer 12 is etched away, leaving the etching stop layer 12 right underneath the bump pads 142 intact. At this point, a plurality of bump pads 142 for connecting with a flip chip and the first circuit trace 10a are formed on the first side (or chip side) 100a of the flip-chip substrate 100. The plurality of bump pads 142, which are embossed on the insulating layer 20, are electrically connected to the corresponding metal contact pads 104 of the first circuit trace 10a, which are inlaid in the insulating layer 20, via the etching stop layer 12 therebetween. On the second side (or board side) 100b of the flip-chip substrate 100, there is provided a plurality of solder ball bond pads 222 of the second circuit trace 22a that is embossed on the insulating layer 20.

Figure 9:
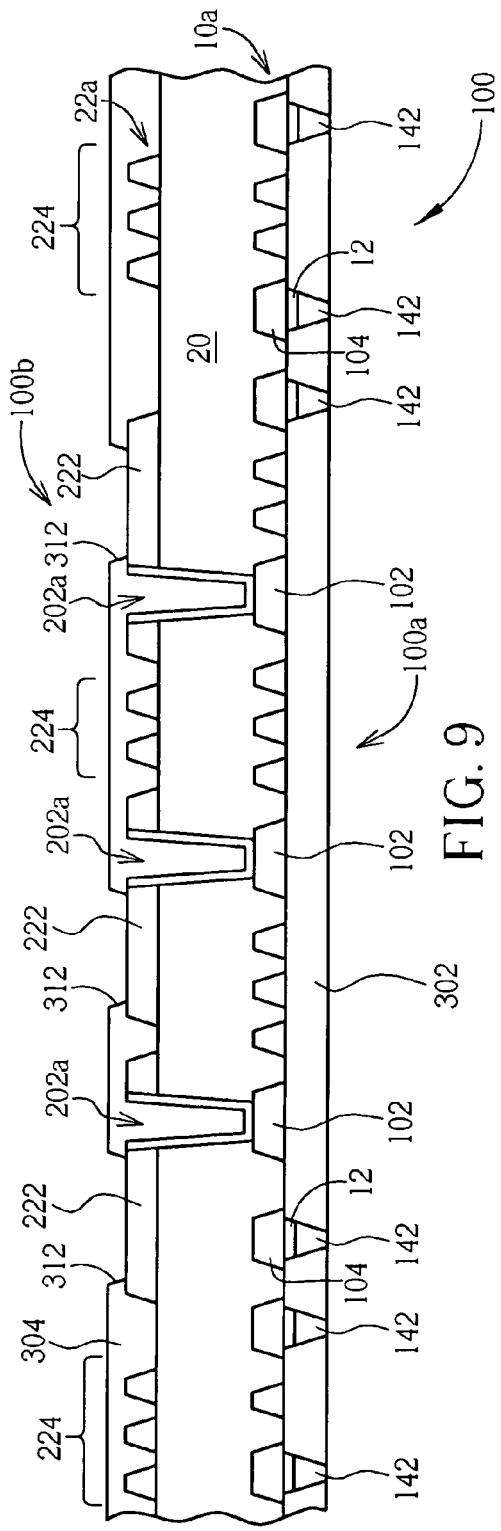

As shown in FIG. 9, a solder mask layer 302 is then formed on the first side 100a of the flip-chip substrate 100 by coating methods or printing methods for example. The solder mask layer 302 fills the spacing between the bump pads 142. Preferably, the top surface of the bump pad 142 is substantially coplanar with the top surface of the solder mask layer 302. In other words, the top surface of the bump pad 142 is exposed and is not covered with the solder mask layer 302. On the second side 100b of the flip-chip substrate 100, a solder mask layer 304 is formed and is then subjected to a light exposure process, then developed to form solder mask openings 312 in the solder mask layer 304, which expose portions of the solder ball bond pads 222.

Figure 10:
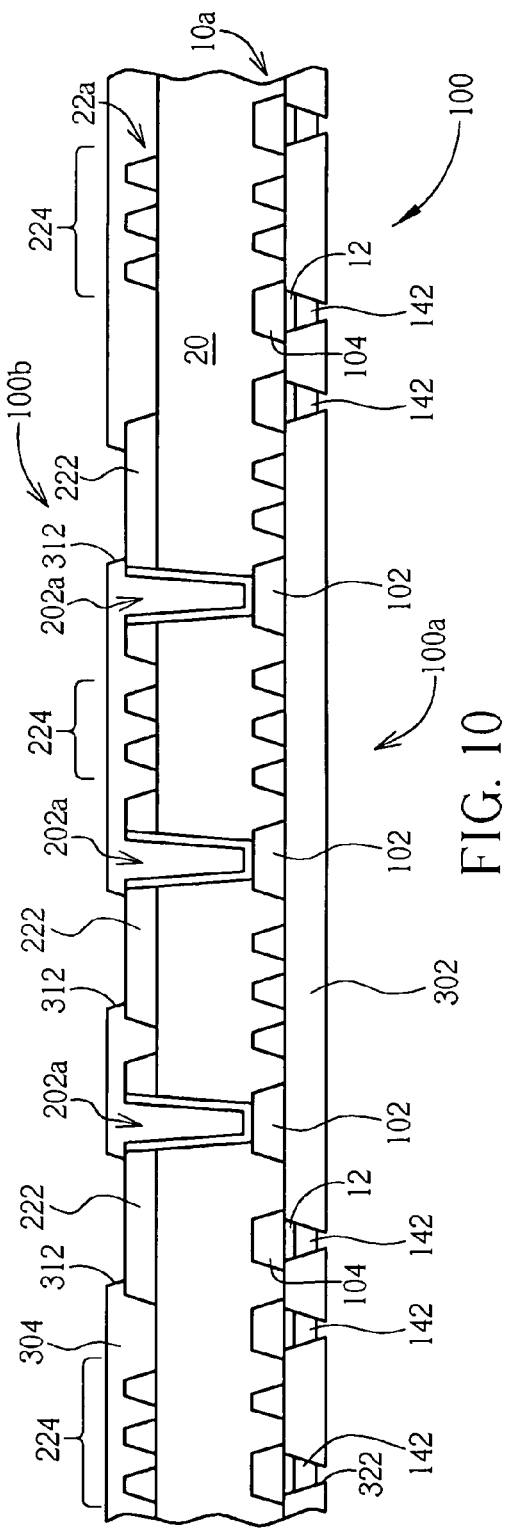

As shown in FIG. 10, on the first side 100a of the flip-chip substrate 100 is then subjected to an etching process to etch away a predetermined thickness of the exposed top surface of the bump pads 142, thereby forming bonding apertures 322 on the first side 100a in a self-aligned fashion. When etching bump pads 142 on the first side 100a, the second side 100b of the flip-chip substrate 100 is protected and covered with a dry-film photoresist layer (not shown). It is advantageous to use the present invention method because the bonding apertures 322 on the first side 100a are formed in self-aligned manner. Since the bonding apertures 322 are not formed by conventional lithographic methods, the bonding apertures 322 on the first side 100a of the flip-chip substrate 100 are accurately aligned with the bump pads 142. The solder mask registration accuracy is therefore greatly improved.

Those skilled in the art will readily observe that numerous modifications and alterations of the device and method may be made while retaining the teachings of the invention.

What is claimed is:

1. A method for fabricating a packaging substrate, comprising:
   providing a cladding sheet comprising a first metal foil, a second metal foil and an etch stop layer interposed between the first and second metal foils;
   patterning the first metal foil into a first circuit trace including a plurality of metal contact pads;
   laminating an insulating layer onto the first circuit trace;
   patterning the second metal foil into a plurality of bump pads;
   removing the etch stop layer that is not covered by the bump pads, thereby exposing a portion of the insulating layer and the first circuit trace;
   applying a solder mask onto the exposed insulating layer and the first circuit trace to fill spacing between the bump pads, wherein a top surface of each of the bump pads is not covered by the solder mask; and
   etching away a predetermined thickness of the top surface of each of the bump pads to form a bonding aperture in a self-aligned fashion.

2. The method according to claim 1 wherein the first metal foil comprises copper.

3. The method according to claim 1 wherein the second metal foil comprises copper.

4. The method according to claim 1 wherein the etch stop layer comprises nickel or silver.

5. The method according to claim 1 wherein the second metal foil has a thickness that is greater than that of the first metal foil.

6. The method according to claim 1 wherein the insulating layer comprises prepreg, Ajinomoto Build-up Film (ABF), epoxy resins or polyimide.

7. The method according to claim 1 further comprising a copper thickness reduction process to reduce the second metal layer to a pre-selected thickness range respectively.

8. The method according to claim 7 wherein the pre-selected thickness range is 15-25 micrometers.

9. A method for fabricating a packaging substrate, comprising:
   providing a cladding sheet comprising a first metal foil, a second metal foil and an etch stop layer interposed between the first and second metal foils;

patterning the first metal foil into a first circuit trace including a plurality of via landing pads and a plurality of metal contact pads;

laminating an insulating layer onto the first circuit trace and a third metal foil on the insulating layer;

forming a plurality of plated via holes in the insulating layer to interconnect the third metal foil with the via landing pads;

patterning the third metal foil into a second circuit trace;

patterning the second metal foil into a plurality of bump pads;

removing the etch stop layer that is not covered by the bump pads, thereby exposing a portion of the insulating layer and the first circuit trace;

applying a solder mask onto the exposed insulating layer and the first circuit trace to fill spacing between the bump pads, wherein a top surface of each of the bump pads is not covered by the solder mask; and etching away a predetermined thickness of the top surface of each of the bump pads to form a bonding aperture in a self-aligned fashion.

10. The method according to claim 9 wherein the first metal foil comprises copper.

11. The method according to claim 9 wherein the second metal foil comprises copper.

12. The method according to claim 9 wherein the etch stop layer comprises nickel or silver.

13. The method according to claim 9 wherein the second metal foil has a thickness that is greater than that of the first metal foil.

14. The method according to claim 9 wherein the insulating layer comprises prepreg, Ajinomoto Build-up Film (ABF), epoxy resins or polyimide.

15. The method according to claim 9 further comprising a copper thickness reduction process to reduce the second metal layer and the third metal layer to a pre-selected thickness range respectively.

16. The method according to claim 15 wherein the pre-selected thickness range is 15-25 micrometers.

17. The method according to claim 9 wherein the second circuit trace comprises solder ball bond pads and fine-pitch circuit traces.

* * * * *